(12) United States Patent
Chen

(10) Patent No.: US 12,016,183 B2
(45) Date of Patent: Jun. 18, 2024

(54) MEMORY CHIP INCLUDING CONTROL LOGIC CIRCUIT WITH DYNAMIC RANDOM-ACCESS MEMORY AND MEMORY DEVICE INCLUDING MEMORY CHIPS

(71) Applicant: HON HAI PRECISION INDUSTRY CO., LTD., New Taipei (TW)

(72) Inventor: Yan-Ru Chen, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 429 days.

(21) Appl. No.: 17/453,342

(22) Filed: Nov. 2, 2021

(65) Prior Publication Data

US 2023/0094941 A1    Mar. 30, 2023

(30) Foreign Application Priority Data

Sep. 29, 2021   (TW) .................... 110136315

(51) Int. Cl.
| | | |
|---|---|---|
| H10B 43/40 | (2023.01) | |
| H01L 23/535 | (2006.01) | |
| H01L 25/065 | (2023.01) | |
| H10B 41/27 | (2023.01) | |
| H10B 41/41 | (2023.01) | |
| H10B 43/27 | (2023.01) | |

(52) U.S. Cl.
CPC ........... *H10B 43/40* (2023.02); *H01L 23/535* (2013.01); *H01L 25/0657* (2013.01); *H10B 41/27* (2023.02); *H10B 41/41* (2023.02); *H10B 43/27* (2023.02); *H01L 2225/06506* (2013.01)

(58) Field of Classification Search
CPC ....... H10B 43/40; H10B 41/41; H01L 23/535; H01L 25/0657; H01L 2225/06506
See application file for complete search history.

(56) References Cited

U.S. PATENT DOCUMENTS

| | | | |
|---|---|---|---|
| 6,255,151 B1 * | 7/2001 | Fukuda | .................. H01L 28/40 257/E23.161 |
| 2016/0267968 A1 | 9/2016 | Murooka | |
| 2017/0245023 A1 * | 8/2017 | Brelis | ................ H04N 21/4627 |
| 2021/0210142 A1 * | 7/2021 | Liu | ....................... H10B 12/033 |
| 2022/0308969 A1 * | 9/2022 | Tang | .................. G11C 16/0483 |
| 2022/0328511 A1 * | 10/2022 | Chung | ................... H10B 41/41 |

FOREIGN PATENT DOCUMENTS

| | | |
|---|---|---|
| TW | I628745 B | 7/2018 |
| TW | I653746 B | 3/2019 |
| TW | 202018921 A | 5/2020 |
| TW | 202042378 A | 11/2020 |
| TW | 721012 B | 3/2021 |

* cited by examiner

*Primary Examiner* — Nduka E Ojeh
(74) *Attorney, Agent, or Firm* — CKC & Partners Co., LLC

(57) ABSTRACT

A memory chip includes a memory cell circuit, a periphery circuit, an interconnect structure, and a control logic circuit. The periphery circuit is positioned under the memory cell circuit and electrically connected to the memory cell circuit. The interconnect structure is positioned on a side surface of the memory cell circuit. The control logic circuit is positioned under the interconnect structure. The control logic circuit is electrically connected to the interconnect structure and the periphery circuit and includes a dynamic random-access memory.

8 Claims, 9 Drawing Sheets ically connected to the peripheral circuit.

MEMORY CHIP INCLUDING CONTROL LOGIC CIRCUIT WITH DYNAMIC RANDOM-ACCESS MEMORY AND MEMORY DEVICE INCLUDING MEMORY CHIPS

CROSS-REFERENCE TO RELATED APPLICATION

This application claims priority to Taiwan Application Serial Number 110136315, filed Sep. 29, 2021, which is herein incorporated by reference.

BACKGROUND

Field of Invention

The present disclosure relates to a memory chip and a memory device.

Description of Related Art

Generally speaking, in an electronic device including a memory chip, a controller chip is usually required to manage or control the memory chip. However, since the controller chip and the memory chip are set independently, it will increase the cost of manufacturing the electronic device, such as the packaging cost. Furthermore, since the electronic device includes multiple chips, it is not conducive to miniaturization of the memory device. However, in recent years, an electronic device is developed towards high integration, miniaturization, and high speed.

In view of the above, it is necessary to provide a new memory chip to overcome the above problems.

SUMMARY

The present disclosure provides a memory chip including a memory cell circuit, a periphery circuit, an interconnect structure, and a control logic circuit. The periphery circuit is positioned under the memory cell circuit and is electrically connected to the memory cell circuit. The interconnect structure is positioned on a side surface of the memory cell circuit. The control logic circuit is positioned under the interconnect structure. The control logic circuit is electrically connected to the interconnect structure and the periphery circuit and includes a dynamic random-access memory (DRAM).

In some embodiments, the dynamic random-access memory includes a capacitor array. The capacitor array includes a plurality of capacitors, and each capacitor includes a conductive pillar, an insulating layer, and a conductive contact. The insulating layer covers a side surface and a lower surface of the conductive pillar. The conductive contact is positioned under the insulating layer.

In some embodiments, the control logic circuit includes a reduced instruction set computer core (RISC core) and a memory controller. The reduced instruction set computer core is connected to the memory controller and the dynamic random-access memory. The memory controller is electri- In some embodiments, the control logic circuit further includes a read-only memory (ROM), and the read-only memory is connected to the reduced instruction set computer core.

In some embodiments, the control logic circuit further includes an error correction circuit (ECC), and the error correction circuit is connected to the memory controller.

In some embodiments, the control logic circuit further includes an interface circuit and a power management circuit. The interface circuit is connected to the power management circuit and the reduced instruction set computer core, and is connected to the interconnect structure.

In some embodiments, the peripheral circuit includes a logic control, a register, a decoder, and an input and output control (I/O control). The register is connected to the logic control and the input and output control. The decoder is connected to the logic control and the input and output control.

In some embodiments, the memory chip further includes a power management circuit, in which the logic control is connected to the power management circuit.

In some embodiments, the memory cell circuit is a non-volatile memory (NVM) cell circuit.

The present disclosure provides a memory device including at least two memory chips described in any one of the above embodiments and at least one bonding wire. The memory chips are stacked. The interconnect structures in the memory chips are electrically connected to each other by the at least one bonding wire.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
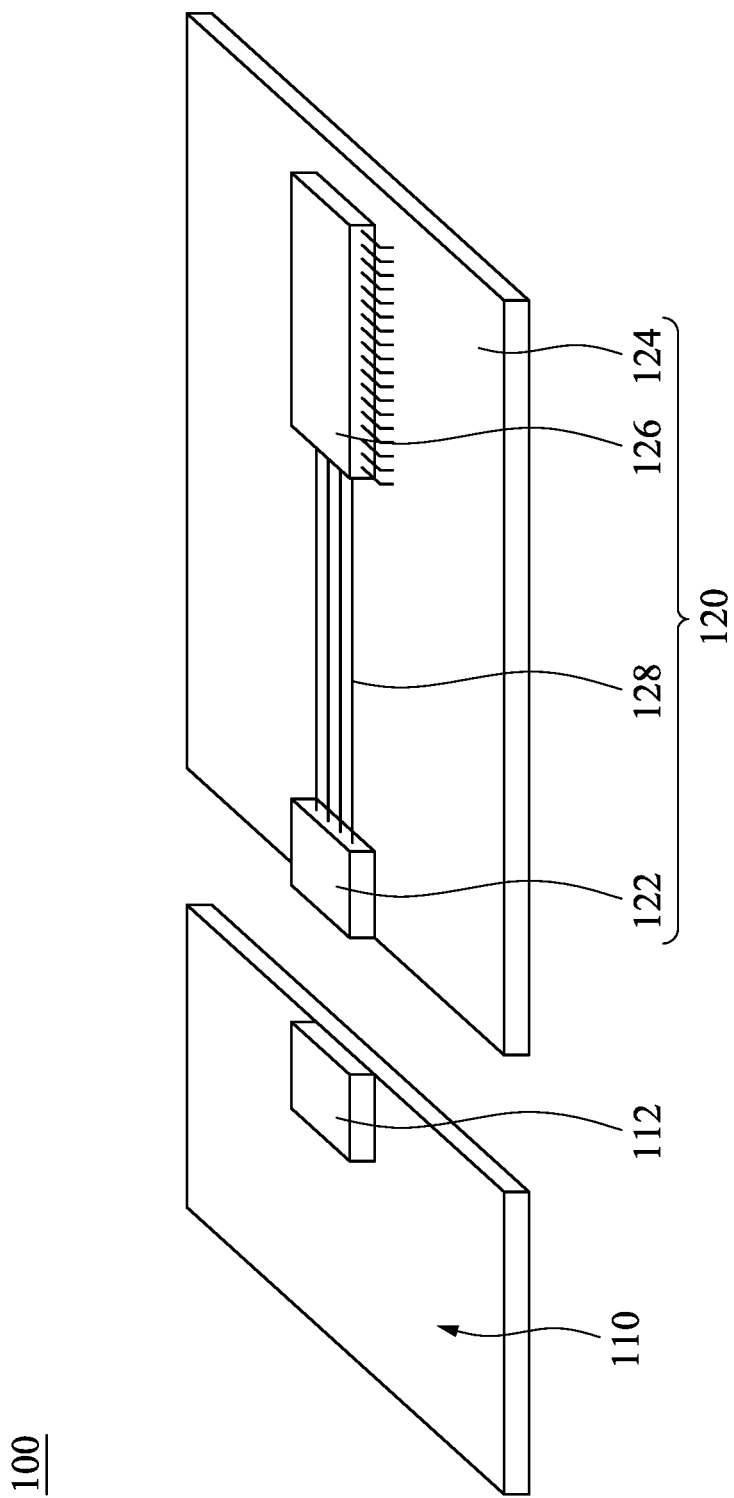
FIG. 1 is a schematic diagram of an electronic device in accordance with various embodiments of the present disclosure.

In order to make the description of the present disclosure more detailed and complete, reference can be made to the attached drawings and the various embodiments described below, where the same numbers in the drawings represent the same or similar components.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 2:
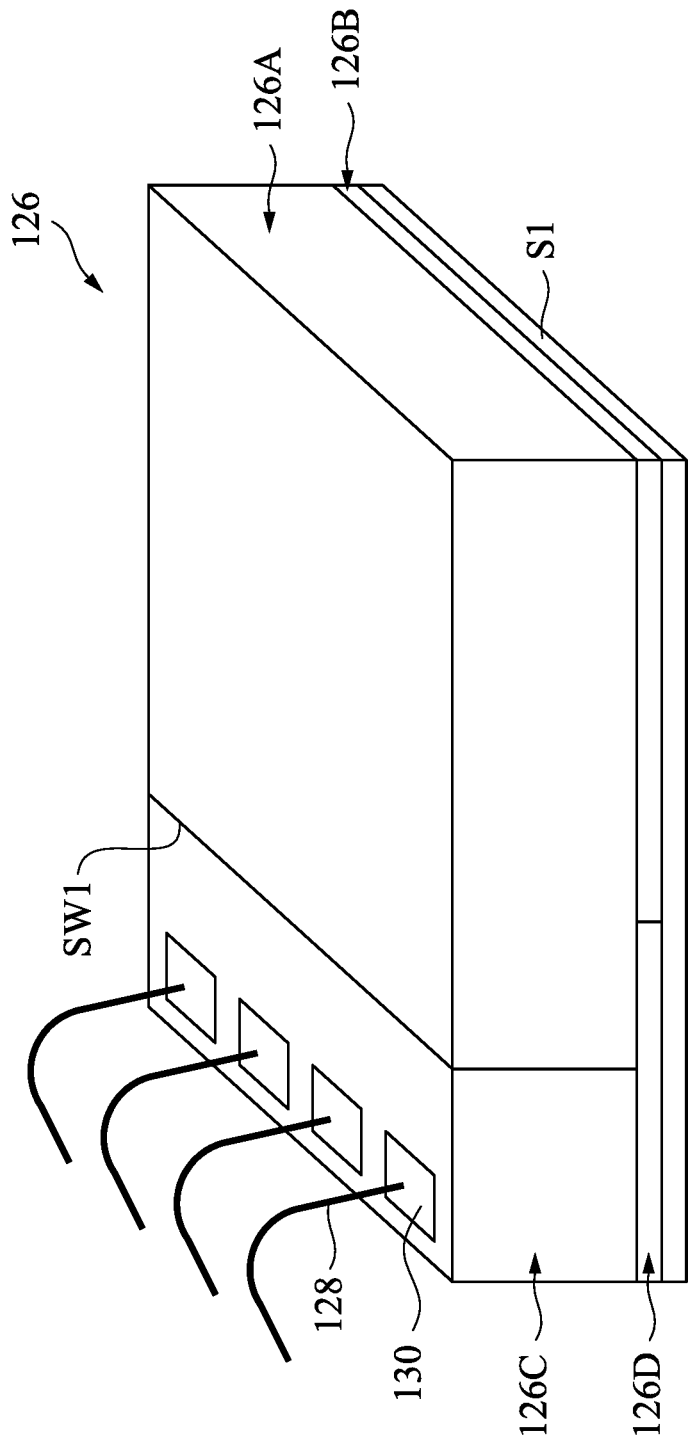
FIG. 2 is a schematic diagram of a memory chip in accordance with various embodiments of the present disclosure.

The present disclosure provides an electronic device that includes a memory chip. FIG. 1 is a schematic diagram of an electronic device in accordance with various embodiments of the present disclosure. FIG. 2 is a schematic diagram of a memory chip in accordance with various embodiments of the present disclosure.

As shown in FIG. 1, an electronic device 100 includes a host 110 and a memory device 120. The host 110 has a first connector 112. The memory device 120 includes a circuit board 124, a second connector 122, a memory chip 126, and bonding wires 128. The second connector 122 and the memory chip 126 are disposed on the circuit board 124. The memory chip 126 is connected to the second connector 122 by the bonding wires 128. When the first connector 112 is connected to the second connector 122, the host 110 can read information of the memory chip 126 or write information to the memory chip 126. The host 110 includes a processor. In some embodiments, the memory chip 126 is a NAND Flash memory chip. In some embodiments, the memory device 120 may be applied to a secure digital memory card (SD card), a solid-state drive (or solid-state disk, SSD). In some embodiments, the first connector 112 and the second connector 122 are universal serial bus (USB).

As shown in FIG. 2, the memory chip 126 includes a semiconductor substrate S1, a memory cell circuit 126A, a peripheral circuit 126B, an interconnect structure 126C, and a control logic circuit 126D. The periphery circuit 126B and the control logic circuit 126D are positioned on the semiconductor substrate S1. In other words, the peripheral circuit 126B and the control logic circuit 126D are manufactured and designed on the same semiconductor substrate S1. Therefore, it is beneficial to simplify the manufacturing process of the electronic device 100 shown in FIG. 1. Moreover, since the control logic circuit 126D is integrated in the memory chip 126 and is disposed under the memory cell circuit 126A, the control logic circuit 126D can manage or control the memory cell circuit 126A. The control logic circuit 126D can accept commands, addresses, and data from the host 110, store these information, and transmit them to the memory cell circuit 126A. Therefore, there is no need to provide a controller chip in the electronic device 100 shown in FIG. 1. In other words, the electronic device 100 does not include a controller chip. Therefore, the cost of manufacturing the electronic device 100 can be reduced, and the volume of the electronic device 100 can be miniaturized. The space saved can be set with more memory chips, which can further increase the storage space of the memory. Moreover, compared to a structure that includes a host and a memory chip transmitted through a controller chip, since the transmission path between the control logic circuit 126D and the peripheral circuit 126б of the present disclosure is shorter, the electronic device 100 can achieve a faster transmission speed.

Please continue to refer to FIG. 2. The peripheral circuit 126B is positioned under the memory cell circuit 126A and is electrically connected to the memory cell circuit 126A. The interconnect structure 126C is positioned on a side surface SW1 of the memory cell circuit 126A. The control logic circuit 126D is positioned under the interconnect structure 126C. The control logic circuit 126D is electrically connected to the interconnect structure 126C and the peripheral circuit 126B. The bonding wires 128 extend from bonding pads 130 on the top of the interconnect structure 126C. In some embodiments, the memory cell circuit 126A is a non-volatile memory (NVM) cell circuit, such as a flash memory cell circuit. In some embodiments, the memory cell circuit 126A is a 3D NAND flash memory cell circuit. The "3D NAND flash memory" mentioned in the present disclosure refers to a semiconductor device with a transistor with memory cells connected in series in a vertical direction on a substrate placed in a horizontal direction. The "3D NAND flash memory" can be called a memory string, such as a NAND string. The memory string extends in a vertical direction relative to the substrate, which refers to that the memory string is vertical to the horizontal surface of the substrate. In some embodiments, the semiconductor substrate S1 includes silicon, silicon germanium, silicon carbide, silicon-on-insulation, germanium-on-insulation, glass, gallium nitride, gallium arsenide, and/or other suitable III-V compounds. In some embodiments, the semiconductor substrate S1 is a silicon substrate and includes single crystal silicon, polycrystalline silicon, or amorphous silicon.

As shown in FIG. 2, the control logic circuit 126D is positioned under the interconnect structure 126C and the memory cell circuit 126A. The peripheral circuit 126B is only positioned under the memory cell circuit 126A. The interface between the control logic circuit 126D and the peripheral circuit 126B is not aligned with the interface between memory cell circuit 126A and interconnect structure126C. In other embodiments, the peripheral circuit 126B is positioned under the interconnect structure 126C and the memory cell circuit 126A, and the control logic circuit 126D is only positioned under the interconnect structure 126C.

Figure 3:
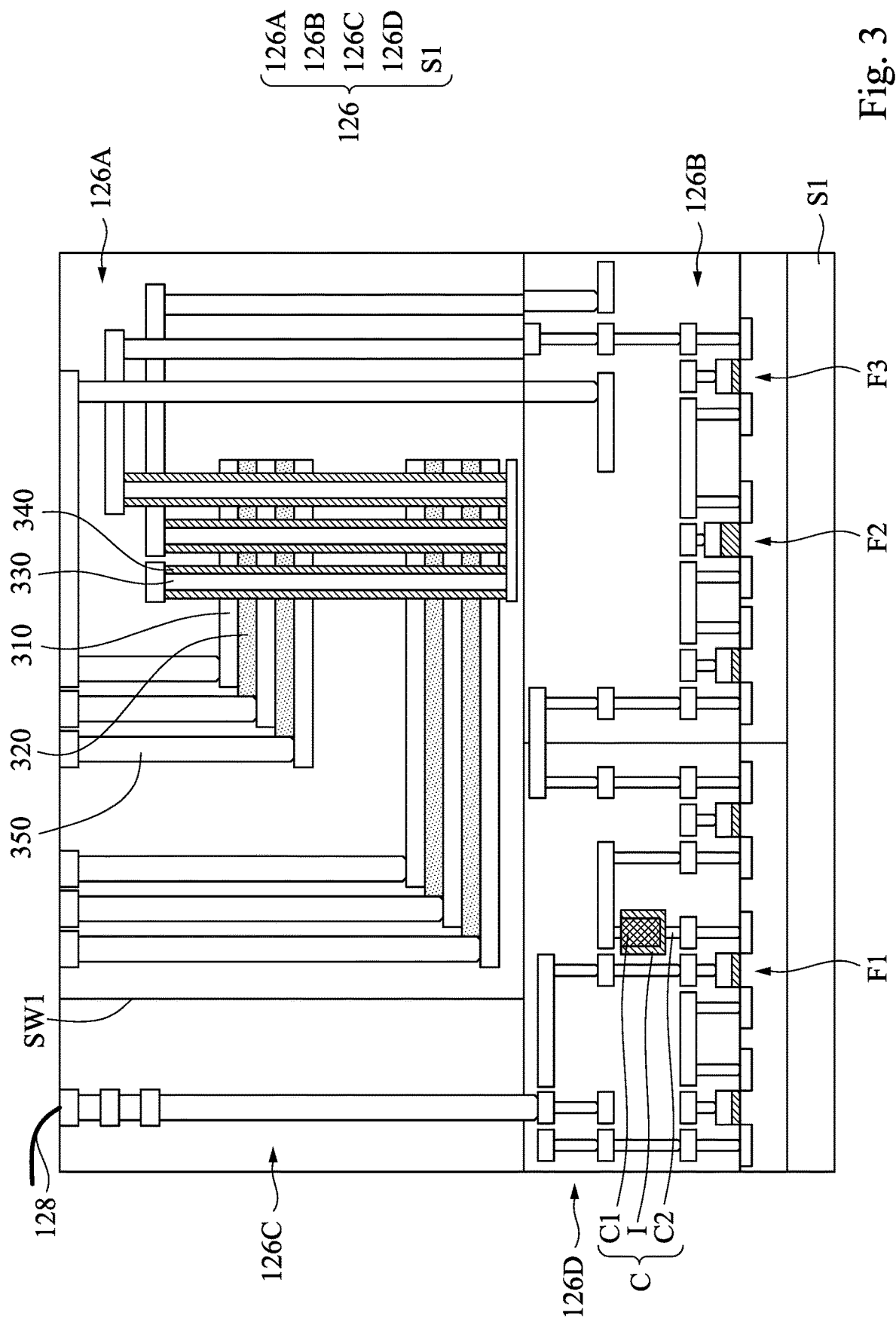
FIG. 3 is a cross-sectional diagram of a memory chip in accordance with various embodiments of the present disclosure.

FIG. 3 is a cross-sectional diagram of the memory chip 126 in accordance with various embodiments of the present disclosure. In some embodiments, the control logic circuit 126D includes a dynamic random-access memory (DRAM). In some embodiments, the dynamic random-access memory includes a capacitor array, and the capacitor array includes a plurality of capacitors. To simplify the illustration, FIG. 3 only shows one capacitor C in the dynamic random-access memory. The required number of capacitor C in the dynamic random-access memory can be set according to design requirements. The capacitor C includes a conductive pillar C1, an insulating layer I, and a conductive contact C2. The insulating layer I covers the side surface and the lower surface of the conductive pillar C1. The conductive contact C2 is positioned under the insulating layer I. In some embodiments, the upper surface of the conductive pillar C1 is substantially coplanar with the upper surface of the insulating layer I. In some embodiments, the insulating layer I covers all side surfaces of the conductive pillar C1. However, the capacitor structure of the present disclosure is not limited to the above. In addition, the control logic circuit 126D includes a plurality of transistors F1, such as metal-oxide-semiconductor field-effect transistors (MOSFETs). For example, the MOSFET is a low-voltage MOSFET or a high-voltage MOSFET. The periphery circuit 126б includes a plurality of transistors F2 and F3. For example, the transistors F2 and F3 are MOSFETs. For example, the transistor F2 is a high-voltage MOSFET, and the transistor F3 is a low-voltage MOSFET. In some embodiments, the sources and the drains of the transistors F1, F2, and F3 are N+ or P+.

The memory cell circuit 126A includes a plurality of metal layers 310, a plurality of insulating layers 320, a semiconductor channel 330, a plurality of gate insulating layers 340, and a plurality of contact vias 350. The plurality of metal layers 310 and the plurality of insulating layers 320 are alternately stacked. The gate insulating layer 340 surrounds the semiconductor channel 330. In the memory chip 126, the area where the memory cell circuit 126A is provided is called a memory cell. In some embodiments, the memory cell of the present disclosure is a NAND cell. In some embodiments, the semiconductor channel 330 is a silicon channel. The semiconductor channel 330 is further connected to the source area and the drain area to control operations of the memory cell circuit 126A, such as reading, writing, or erasing.

In some embodiments, the control logic circuit 126D may further include other elements, such as a reduced instruction set computer core, a memory controller, a read-only memory, etc. These other elements are not shown in FIG. 3, but they will be further described in FIG. 4 below.

Figure 4:
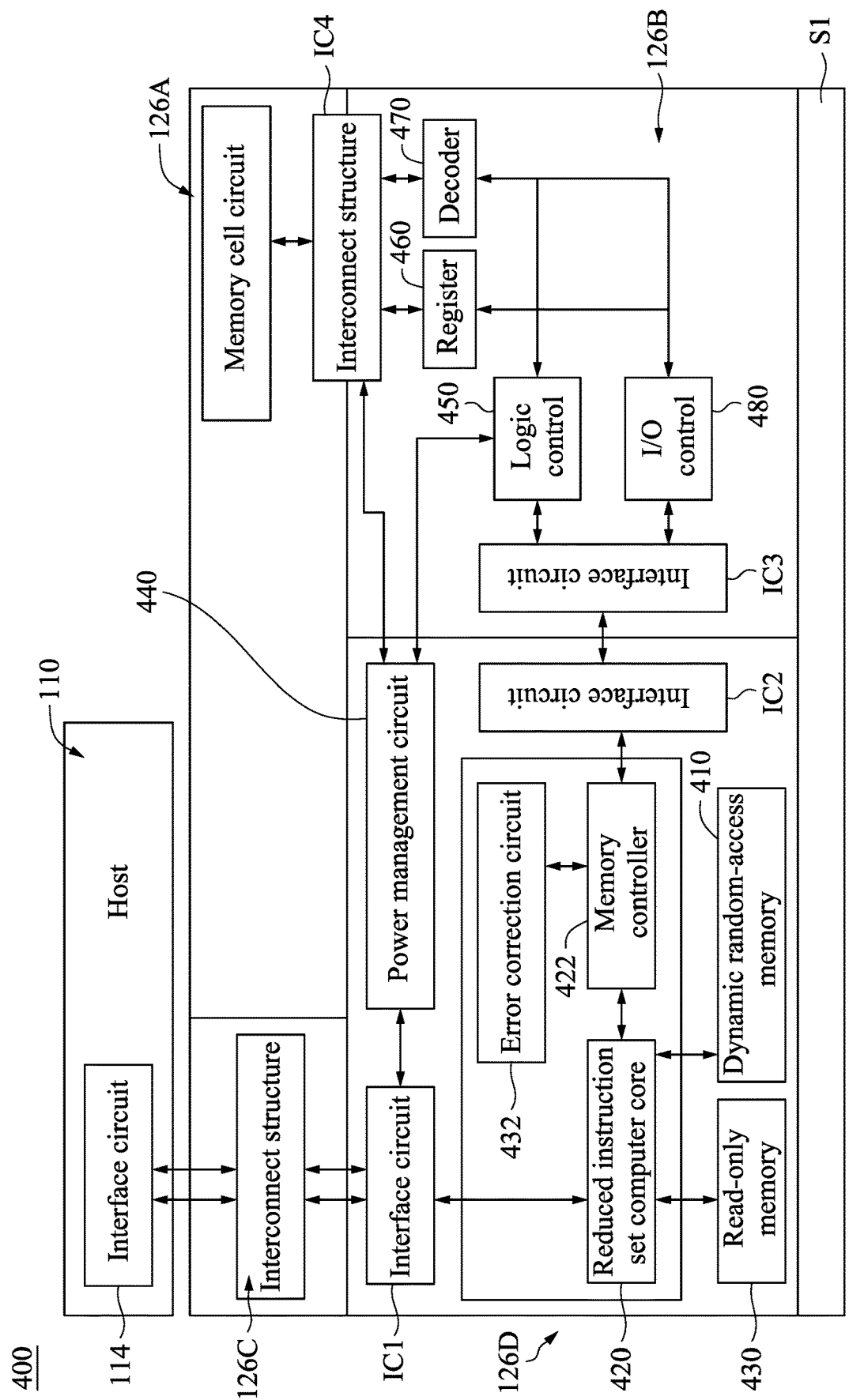
FIGS. 4-5 are schematic diagrams of elements in an electronic device in accordance with various embodiments of the present disclosure.

FIG. 4 is a schematic diagram of elements in an electronic device 400 in accordance with various embodiments of the present disclosure. The memory chip 126 includes the semiconductor substrate S1, the memory cell circuit 126A, the peripheral circuit 1266, the interconnect structure 126C, and the control logic circuit 126D.

The control logic circuit 126D includes a dynamic random-access memory 410, a reduced instruction set computer core (RISC core) 420 and a memory controller 422. The reduced instruction set computer core 420 is connected to the memory controller 422 and the dynamic random-access memory 410. The memory controller 422 is electrically connected to the peripheral circuit 126B. In some embodiments, the dynamic random-access memory 410 includes a capacitor array, and the capacitor array includes a plurality of capacitors. For example, the structure of the capacitor is the same as the capacitor C shown in FIG. 3. In some embodiments, the memory controller 422 is a NAND controller.

In some embodiments, the control logic circuit 126D further includes a read-only memory (ROM) 430, and the read-only memory 430 is connected to the reduced instruction set computer core 420.

In some embodiments, the control logic circuit 126D further includes an error correction circuit (ECC) 432, and the error correction circuit 432 is connected to the memory controller 422.

In some embodiments, the control logic circuit 126D further includes an interface circuit IC1 and a power management circuit 440. The interface circuit IC1 is connected to the power management circuit 440 and the reduced instruction set computer core 420, and is connected to the interconnect structure 126C. In some embodiments, the control logic circuit 126D is electrically connected to the peripheral circuit 126B through the power management circuit 440. In some embodiments, the control logic circuit 126D is electrically connected to the interconnect structure 126C through the interface circuit IC1. In some embodiments, the control logic circuit 126D further includes an interface circuit IC2. The interface circuit IC2 is connected to the memory controller 422. The control logic circuit 126D is electrically connected to the peripheral circuit 126B through the interface circuit IC2.

In some embodiments, as shown in FIG. 4, the peripheral circuit 126B includes a logic control 450, a register 460, a decoder 470, and an I/O control 480. The register 460 is connected to the logic control 450 and the I/O control 480. The decoder 470 is connected to the logic control 450 and the I/O control 480. In some embodiments, the logic control 450 is connected to the power management circuit 440.

In some embodiments, the peripheral circuit 126B further includes an interface circuit IC3. The peripheral circuit 126B is electrically connected to the control logic circuit 126D through the interface circuit IC3. For example, the peripheral circuit 126B is connected to the interface circuit IC2 through the interface circuit IC3 to be electrically connected to the control logic circuit 126D.

In some embodiments, the electronic device 400 further includes an interconnect structure IC4, and the peripheral circuit 126B is electrically connected to the memory cell circuit 126A through the interconnect structure IC4.

In some embodiments, the host 110 includes an interface circuit 114. The host 110 is connected to the interface circuit IC1 of the interconnect structure 126C through the interface circuit 114.

Figure 5:
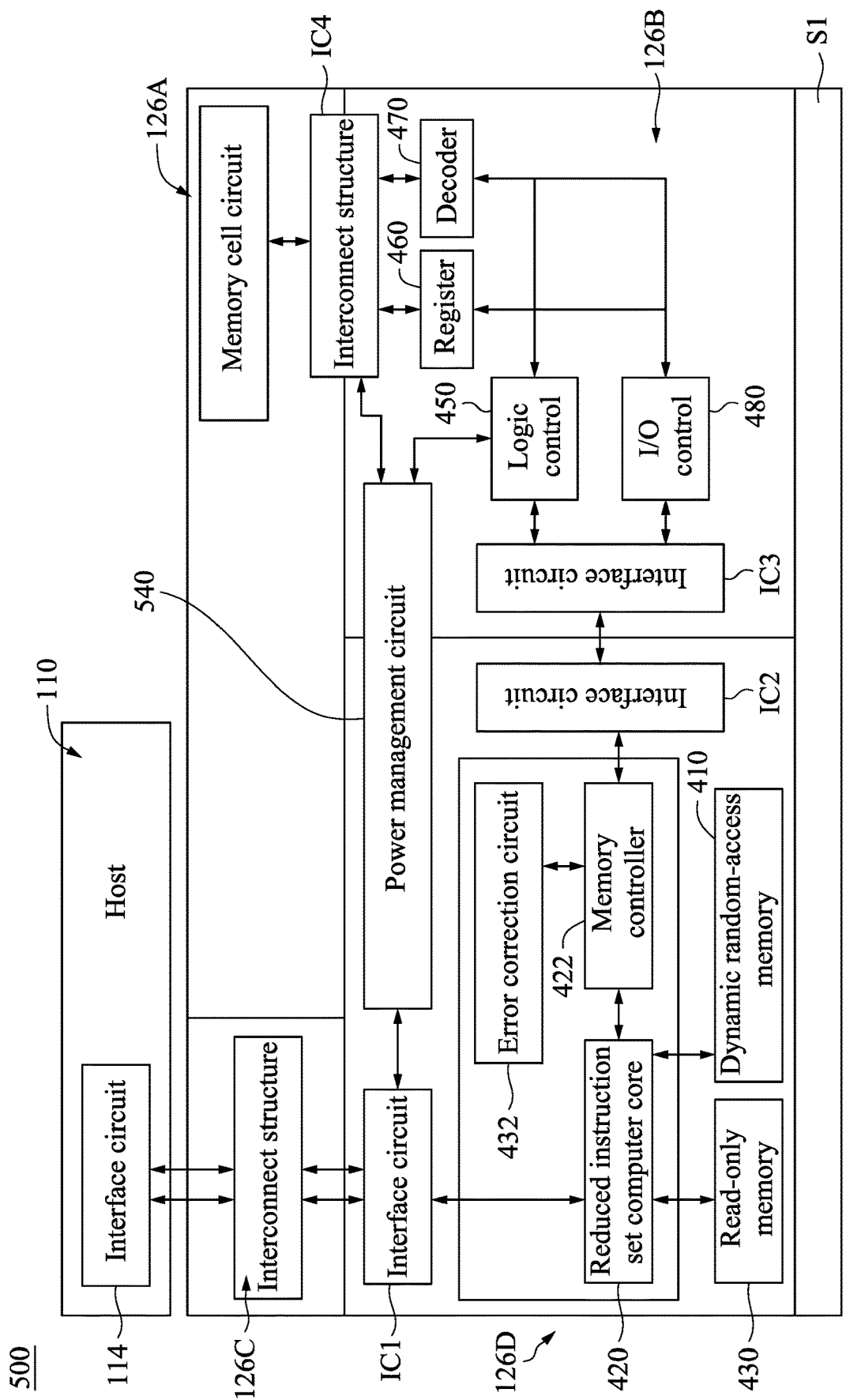

FIG. 5 is a schematic diagram of elements in an electronic device 500 according to various embodiments of the present disclosure. The difference between FIG. 5 and FIG. 4 is that the power management circuit 440 in FIG. 4 is provided in the control logic circuit 126D; however, the power management circuit 540 in FIG. 5 is provided between the control logic circuit 126D and the peripheral circuit 126B. The power management circuit 440 in FIG. 4 is closer to other elements in the control logic circuit 126D, and therefore the transmission speed of the power management circuit 440 is faster than that of the power management circuit 540.

Figure 6:
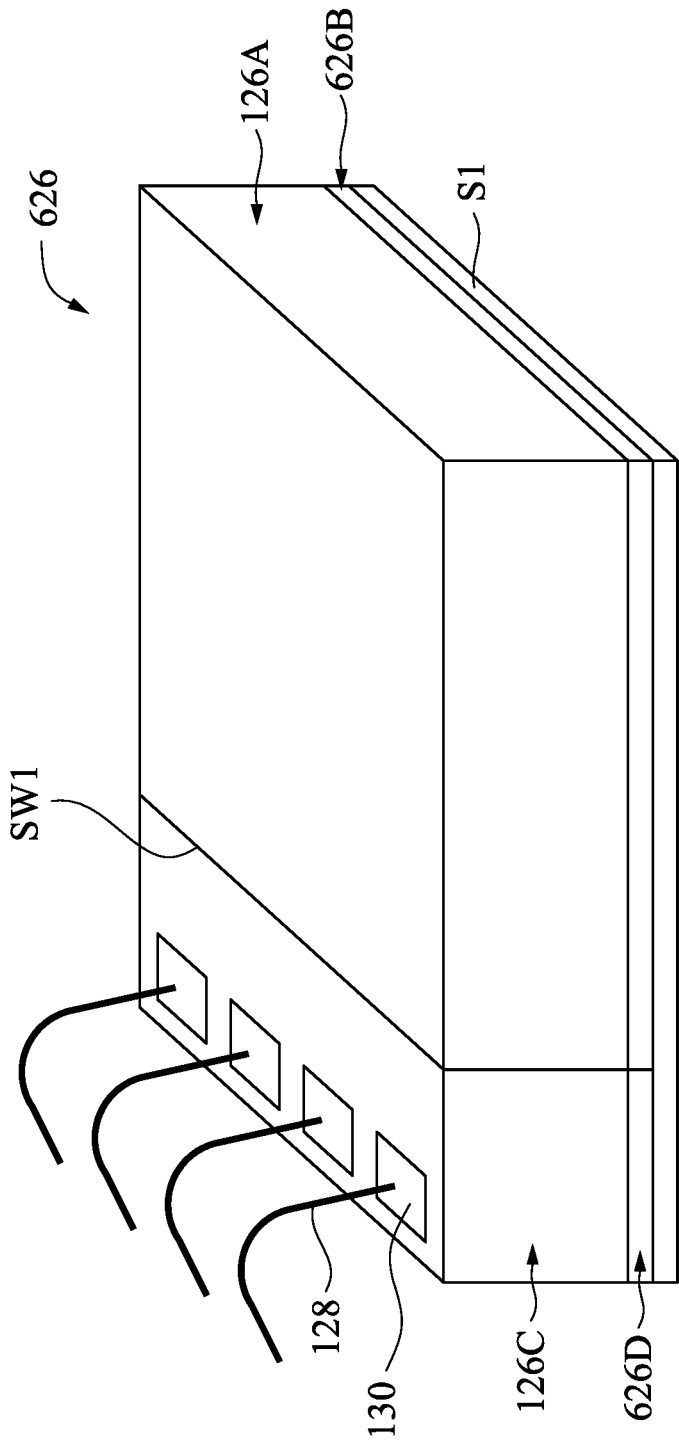
FIG. 6 is a schematic diagram of a memory chip in accordance with various embodiments of the present disclosure.

FIG. 6 is a schematic diagram of a memory chip 626 according to various embodiments of the present disclosure. As shown in FIG. 6, the control logic circuit 626D is positioned under the interconnect structure 126C. The peripheral circuit 626B is positioned under the memory cell circuit 126A. The interface between the control logic circuit 626D and the peripheral circuit 626B is substantially aligned with the interface between the memory cell circuit 126A and the interconnect structure 126C. The difference between FIG. 6 and FIG. 2 is only the configuration of the peripheral circuit and the control logic circuit.

Figure 7:
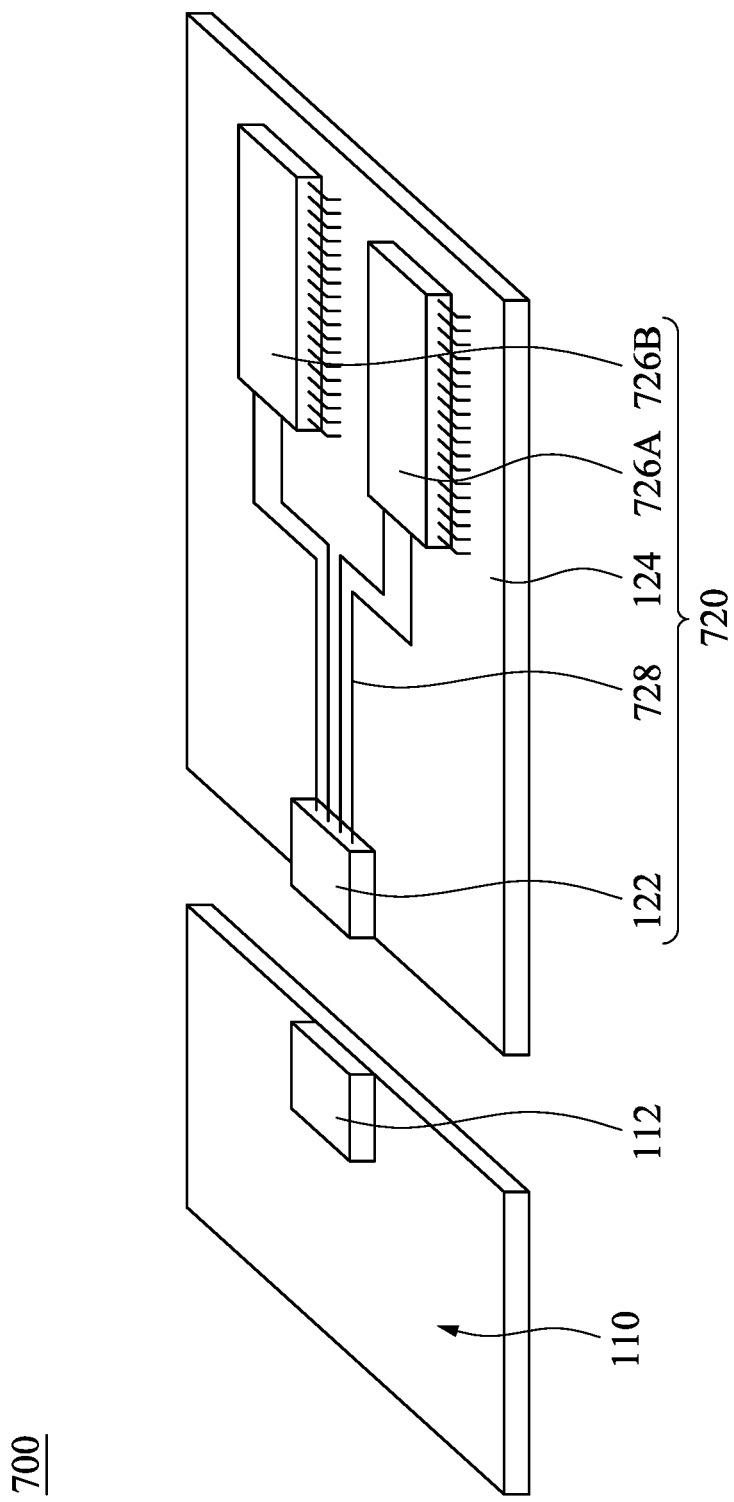
FIGS. 7-8 are schematic diagrams of electronic devices in accordance with various embodiments of the present disclosure.

FIG. 7 is a schematic diagram of an electronic device 700 according to various embodiments of the present disclosure. The electronic device 700 includes the host 110 and a memory device 720. The host 110 has the first connector 112. The memory device 720 includes the circuit board 124, the second connector 122, a first memory chip 726A, a second memory chip 726B, and bonding wires 728. The embodiments of the first memory chip 726A and the second memory chip 726B can refer to the embodiments of the memory chip 126 described above, and will not be repeated here. The difference between FIG. 7 and FIG. 1 is that the second connector 122 of the electronic device 100 in FIG. 1 is connected to one memory chip 126, while the second connector 122 of the electronic device 700 in FIG. 7 is connected to two memory chips, i.e., the first memory chip 726A and the second memory chip 726B. However, the present disclosure is not limited to this, and the number of the memory chips connected to the second connector 122 can be adjusted according to design requirements, such as three, four, five, six, etc.

Figure 8:
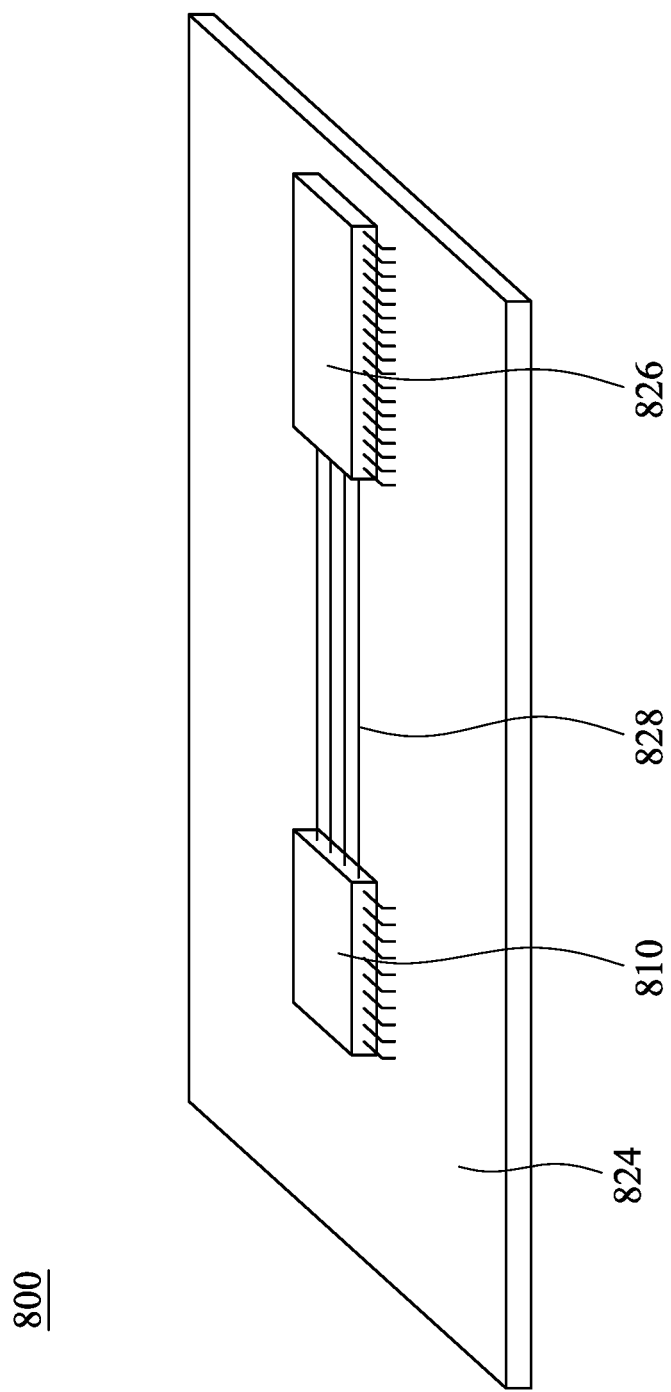

FIG. 8 is a schematic diagram of an electronic device 800 according to various embodiments of the present disclosure. The electronic device 800 includes a host 810, a circuit board 824, a memory chip 826, and bonding wires 828. The host 810 is connected to the memory chip 826 by the bonding wires 828. The host 810 can read information of the memory chip 826 or write information to the memory chip 826. The host 810 includes a processor.

Figure 9:
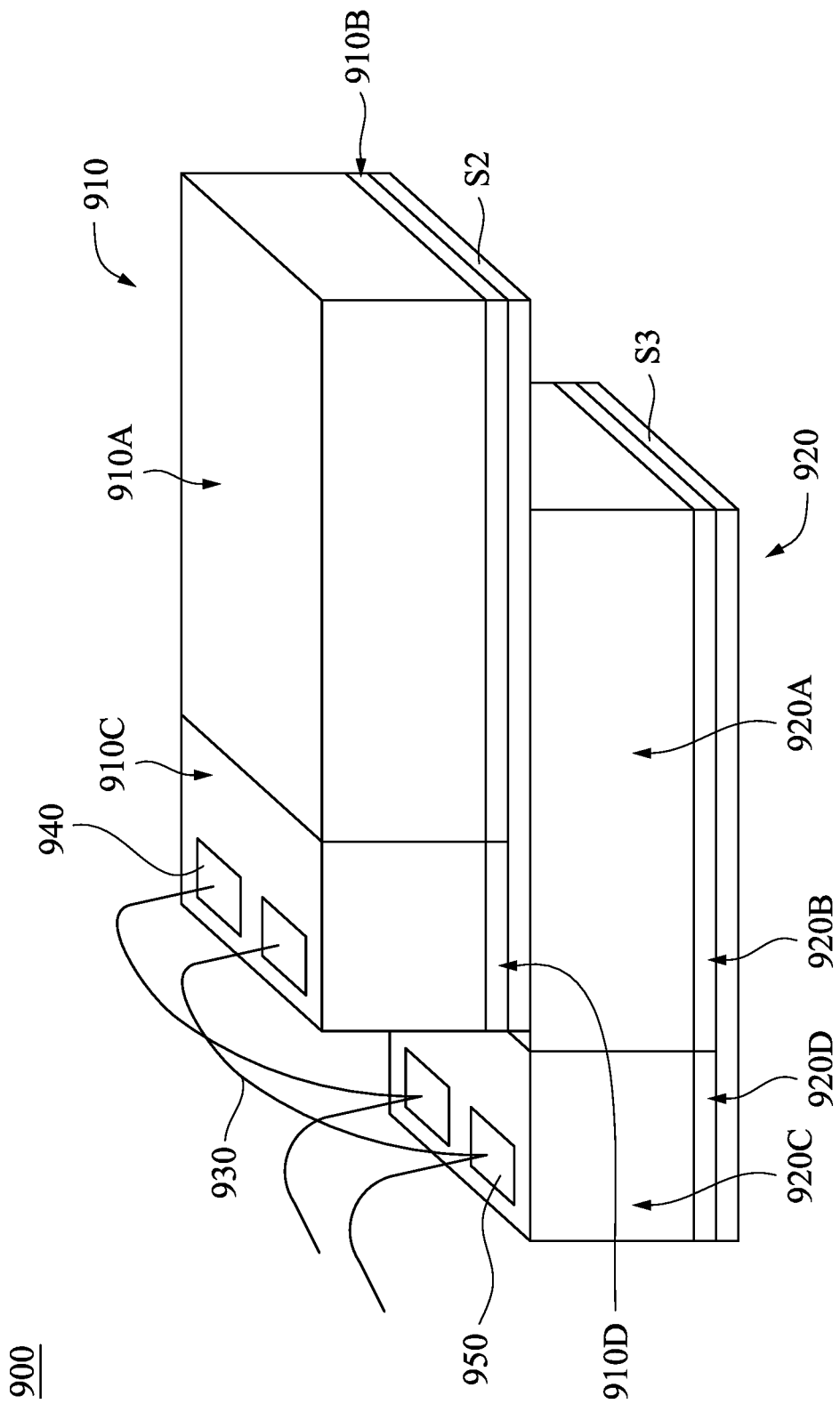
FIG. 9 is a schematic diagram of a memory device in accordance with various embodiments of the present disclosure.

FIG. 9 is a schematic diagram of a memory device 900 according to various embodiments of the present disclosure. The memory device 900 includes at least two memory chips and at least one bonding wire. These memory chips are stacked. The at least one bonding wire electrically connects the interconnect structures in the memory chips with each other. The memory chips are, for example, a memory chip 910 and a memory chip 920, and the memory chip 910 and the memory chip 920 are stacked. The at least one bonding wire is, for example, bonding wires 930. The bonding wires 930 electrically connect the memory chip 910 and the memory chip 920 to each other. The number of the stacked memory chips and the number of the bonding wires can be adjusted according to design requirements. The number of memory chips is, for example, two, three, four, five, or six.

The memory chip 910 includes a semiconductor substrate S2, a memory cell circuit 910A, a peripheral circuit 910B, an interconnect structure 910C, and a control logic circuit 910D. The periphery circuit 910б and the control logic circuit 910D are positioned on the semiconductor substrate S2. The interconnect structure 910C is positioned on the control logic circuit 910D. The memory cell circuit 910A is positioned on the peripheral circuit 910б. The memory chip 920 includes a semiconductor substrate S3, a memory cell circuit 920A, a peripheral circuit 920B, an interconnect structure 920C, and a control logic circuit 920D. The periphery circuit 920B and the control logic circuit 920D are positioned on the semiconductor substrate S3. The interconnect structure 920C is positioned on the control logic circuit 920D. The memory cell circuit 920A is positioned on the peripheral circuit 920B. The bonding wires 930 extend from bonding pads 940 on the top of the interconnect structure 910C, and are connected to bonding pads 950 on the top of the interconnect structure 920C, so that the interconnect structures 910C and 920C are electrically connected to each other. The embodiments of the configuration in the memory chip 910 and the memory chip 920 can refer to the aforementioned embodiments of the memory chip 126, which will not be repeated here.

Please refer to FIGS. 8 and 9 at the same time. In some embodiments, the memory chip 826 in the electronic device 800 can be replaced with the memory device 900. The memory chip 920 of the memory device 900 is connected to the host 810 by the bonding wires 828. In the memory device 900, since the peripheral circuit 910б and control logic circuit 910D are manufactured and designed on the same semiconductor substrate S2, and the peripheral circuit 920B and the control logic circuit 920D are manufactured and designed on the same semiconductor substrate S3, it is beneficial to simplify the manufacturing process of the electronic device 800. The control logic circuit 910D is integrated in the memory chip 910 and can manage or control the memory cell circuit 910A. The control logic circuit 910D can accept commands, addresses, and data from the host 810, store these information, and transmit them to the memory cell circuit 910A. The control logic circuit 920D is integrated in the memory chip 920 and can manage or control the memory cell circuit 920A. The control logic circuit 920D can accept commands, addresses, and data from the host 810, store these information, and transmit them to the memory cell circuit 920A. Therefore, there is no need to provide a controller chip in the electronic device 800. In other words, the electronic device 800 does not include a controller chip. Therefore, the manufacturing cost can be reduced, and the volume of the electronic device 800 can be miniaturized. The space saved can be set with more memory chips, which can further increase the storage space of the memory. Moreover, compared to a structure including a host and a memory chip transmitted through a controller chip, the transmission path between the control logic circuit 910D and the peripheral circuit 910B of the present disclosure is shorter, and the transmission path between the control logic circuit 920D and the peripheral circuit 920B is shorter. Therefore, the electronic device 800 can achieve a faster transmission speed.

In summary, the present disclosure provides a memory chip and a memory device. The control logic circuit is integrated in the memory chip. Therefore, the memory device does not need to be equipped with a controller chip, which can reduce the manufacturing cost of the memory device and increase the signal transmission speed, and is beneficial to miniaturize the volume of the memory device. In addition, because there is no need to set a controller chip, the space saved can be set with more memory chips to increase the storage space of the memory device. It is conducive to the development of electronic devices including this memory chip in the direction of high integration, miniaturization, and high speed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory chip, comprising:
   a memory cell circuit;
   a periphery circuit positioned under the memory cell circuit and electrically connected to the memory cell circuit;
   an interconnect structure positioned on a side surface of the memory cell circuit; and
   a control logic circuit positioned under the interconnect structure, wherein the control logic circuit is electrically connected to the interconnect structure and the periphery circuit, the control logic circuit comprises a dynamic random-access memory, a reduced instruction set computer core, a memory controller, and an error correction circuit, the reduced instruction set computer core is connected to the memory controller and the dynamic random-access memory, the memory controller is electrically connected to the peripheral circuit, and the error correction circuit is connected to the memory controller.

2. The memory chip of claim 1, wherein the dynamic random-access memory comprises a capacitor array, the capacitor array comprises a plurality of capacitors, each capacitor comprises a conductive pillar, an insulating layer, and a conductive contact, the insulating layer covers a side surface and a lower surface of the conductive pillar, and the conductive contact is positioned under the insulating layer.

3. The memory chip of claim 1, wherein the control logic circuit further comprises a read-only memory, and the read-only memory is connected to the reduced instruction set computer core.

4. The memory chip of claim 1, wherein the peripheral circuit comprises a logic control, a register, a decoder, and an input and output control, the register is connected to the logic control and the input and output control, and the decoder is connected to the logic control and the input and output control.

5. The memory chip of claim 4, further comprising a power management circuit, wherein the logic control is connected to the power management circuit.

6. The memory chip of claim 1, wherein the memory cell circuit is a non-volatile memory cell circuit.

7. A memory device, comprising:
at least two memory chips of claim 1, wherein the memory chips are stacked; and
at least one bonding wire, wherein the interconnect structures in the memory chips are electrically connected to each other by the at least one bonding wire.

8. A memory chip, comprising:
a memory cell circuit;
a periphery circuit positioned under the memory cell circuit and electrically connected to the memory cell circuit;
an interconnect structure positioned on a side surface of the memory cell circuit; and
a control logic circuit positioned under the interconnect structure, wherein the control logic circuit is electrically connected to the interconnect structure and the periphery circuit, the control logic circuit comprises a dynamic random-access memory, a reduced instruction set computer core, a memory controller, an interface circuit, and a power management circuit, the reduced instruction set computer core is connected to the memory controller and the dynamic random-access memory, the memory controller is electrically connected to the peripheral circuit, and the interface circuit is connected to the power management circuit and the reduced instruction set computer core and is connected to the interconnect structure.

* * * * *